(12) United States Patent
Kuczynski et al.

(10) Patent No.: US 6,814,589 B1
(45) Date of Patent: Nov. 9, 2004

(54) ELECTRICAL CONNECTOR WITH ELASTOMERIC ELEMENT AND RESTRAINER MEMBER TO OFFSET RELAXATION OF THE ELASTOMER

(75) Inventors: Joseph Kuczynski, Rochester, MN (US); Timothy Jerome Tofil, Rochester, MN (US); Paul Alan Vermilyea, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/691,294

(22) Filed: Oct. 22, 2003

(51) Int. Cl.[7] ............................................. H01R 12/00
(52) U.S. Cl. ......................... 439/67; 439/493; 439/86
(58) Field of Search ........................... 439/67, 77, 492, 439/493, 73, 66, 586, 591, 86

(56) References Cited

U.S. PATENT DOCUMENTS

| | | | |
|---|---|---|---|
| 4,003,621 A | | 1/1977 | Lamp |
| 4,911,644 A | * | 3/1990 | Bond et al. .................... 439/67 |
| 4,913,656 A | * | 4/1990 | Gordon et al. ................ 439/67 |
| 4,997,389 A | * | 3/1991 | Doumani et al. ........... 439/493 |
| 5,099,393 A | * | 3/1992 | Bentlage et al. ............ 361/785 |
| 5,585,138 A | | 12/1996 | Inasaka |
| 6,054,651 A | | 4/2000 | Fogel et al. |
| 6,144,216 A | * | 11/2000 | Kajiwara et al. ........... 324/770 |
| 6,334,247 B1 | | 1/2002 | Beaman et al. |
| 6,500,027 B1 | | 12/2002 | VanDerSanden et al. |

OTHER PUBLICATIONS

U.S. patent application Publication No. US2002/0155728A1 published Oct. 24, 2002, "Semiconductor Chip Assemblies, Methods of Making Same and Components for Same" by Igor Y. Khandros et al.

* cited by examiner

*Primary Examiner*—Tho D. Ta
(74) *Attorney, Agent, or Firm*—Rabin & Berdo, PC

(57) ABSTRACT

An electrical connector includes contact pads on a printed circuit board and contact members on a substrate. The contact members are pressed against the contact pads by a compression mat having compressor fingers. A clamping arrangement forces the compressor fingers against the substrate and thereby presses the contact members against the connector pads. The compression mat is made of elastomeric material, which has a tendency to relax and thus reduce the pressure after the clamping arrangement is tightened. A restrainer member is used to offset this tendency of the polymer to relax. The restrainer member has holes through which the compressor fingers of the compression mat extend.

19 Claims, 2 Drawing Sheets

FIG.4
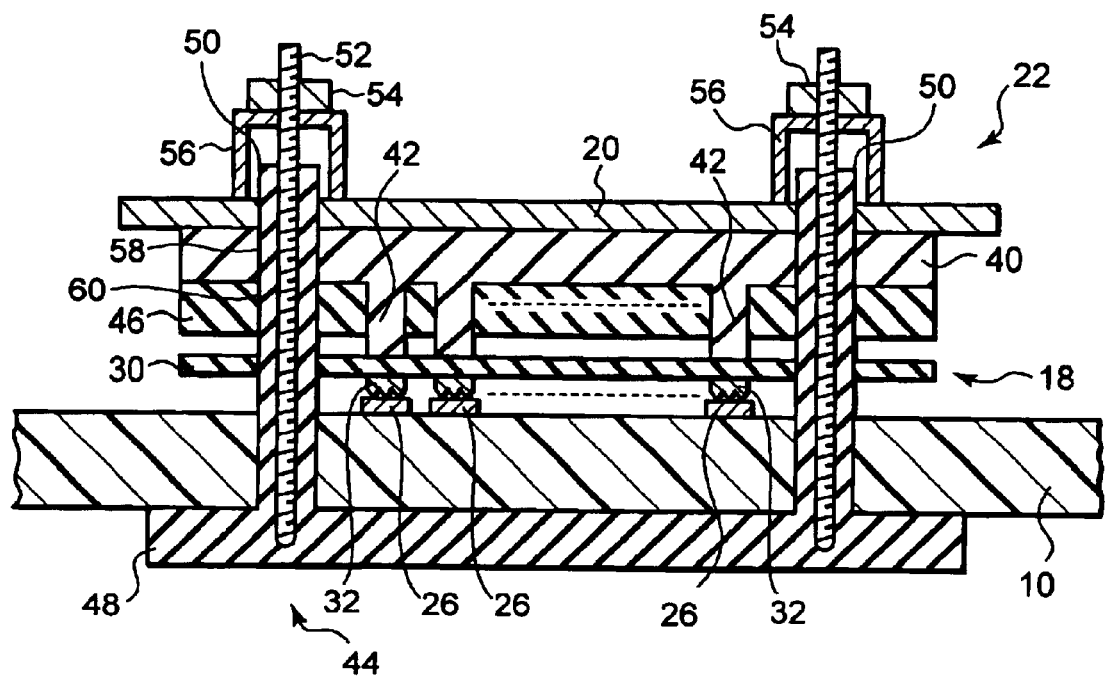
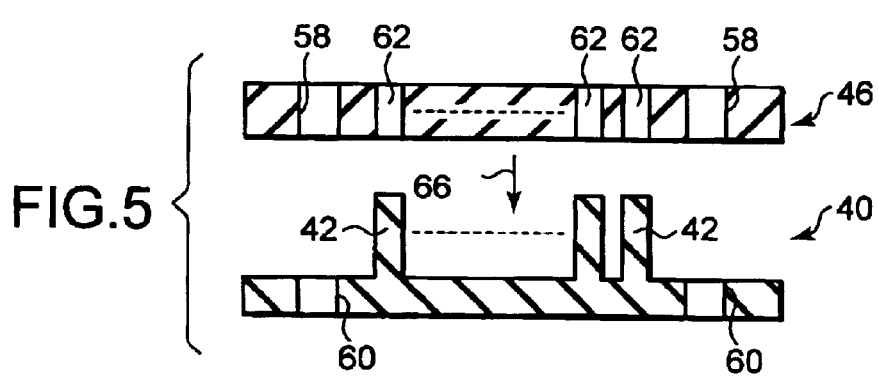
FIG.5

ELECTRICAL CONNECTOR WITH ELASTOMERIC ELEMENT AND RESTRAINER MEMBER TO OFFSET RELAXATION OF THE ELASTOMER

BACKGROUND OF THE INVENTION

The present invention is directed to an electrical connector for use with printed circuit boards. More particularly, the invention is directed to a connector of the type that uses a compression mat made out of elastomer material in order to press contact members against contact pads.

Connectors are in widespread use in the electronics industry. One class of electrical connectors employs a first mechanical support that holds first contacts and a second mechanical support that holds second contacts. In use, the first and second contacts are either pressed against one another or inserted one inside the other. One disadvantage of this class of connector is that at least one of the first and second mechanical supports must typically be mounted on a housing or other structure, and the contacts must be soldered to conductors.

In another class of connectors, printed circuit wiring extends to the edge of a printed circuit board. The edge of the printed circuit board is inserted into a fixture having contacts that engage the wiring.

In a further class of connectors, contact members on a ribbon cable are pressed against contact pads on a printed circuit board. Pressure is exerted on the back of the ribbon cable by a compression mat having compressor fingers that are aligned with the contact members and contact pads. The compression mat is clamped to the printed circuit board. The compression mat and its compressor fingers are made of elastomer materials, and the compressor fingers act somewhat as springs. When the clamping arrangement is tightened, the compressor fingers are placed under state of compression and bulge outward, like small barrels. A connector of this type is disclosed in U.S. Pat. No. 6,607,120.

Connectors of this latter type have a drawback in that the elastomer material of the compression mat has a tendency to relax after the clamping arrangement has been tightened to a desired state. The compressor fingers bulge outward and assume a shape that becomes more barrel-like with the passage of time. The relaxation of the material reduces the pressure forcing the contact members against the connector pads, and thus may lead to faulty connections.

One might consider adjusting the geometry or hardness of a compression mat in an attempt to minimize this stress relaxation. However, as the hardness of a compression mat increases, so does the actuation load that is required to compress the compressor fingers to the necessary degree. Furthermore, attempts might be made to shorten the compressor fingers in an attempt to minimize stress relaxation, but shorter, compression fingers pose reliability concerns due to assembly tolerance stack (e.g., compressor fingers that are not quite long enough but are still within tolerance may not press the contact members against the contact pads with sufficient force to ensure a reliable connection).

Another problem with conventional compression mats is that the compression fingers are prone to off-axis loading, so that one or more compressor fingers may skew to one side. This phenomenon, too, is detrimental to reliability.

SUMMARY OF THE INVENTION

The primary object of the present invention is to provide a connector which employs an elastomeric compression mat for pressing contact members against contact pads on a printed circuit board, but without the drawbacks discussed above with respect to the prior art.

A related object is to improve the reliability of a connector which employs a compression mat to force contact members against contact pads.

A further object is to provide a restrainer member that reduces the tendency of a compression mat to relax after initial compression and which also reduces skewing of the compressor fingers of a compression mat.

In accordance with one aspect of the invention, these and other objects that will become apparent in the ensuing detailed description can be attained by providing a connector that includes connector pads in a contact region on a printed circuit board and contact members that are disposed in a contact region on a first side of an insulating substrate. The contact region of the substrate is aligned with the contact region of the printed circuit board. The connector also includes a compression mat having compressor fingers that contact a second side of the substrate in alignment with the contact members on the first side, and a clamping arrangement to press the compression mat toward the printed circuit board. In order to counteract the inherent tendency of the compressor fingers to undergo stress relaxation after the compressor mat has been clamped, the connector also includes a restrainer member having holes through which the compressor fingers of the compressor mat extend.

In accordance with another aspect of the invention, a compression mat having compressor fingers is used in conjunction with a restrainer member in a method for electrically connecting pads that are disposed within a contact region on a printed circuit board to contact members that are disposed within a contact region on a first side of an insulating substrate. The method includes the step of bracing the compressor fingers with the restrainer member, which has holes through which the compressor fingers extend. The method also includes the step of placing the contact region of the substrate in a face-to-face relationship with the contract region of the printed circuit board and the step of positioning the compression mat adjacent a second side of the substrate, with the contact fingers being aligned with the contact members on the first side of the substrate. Finally, the method includes the step of pressing the compression mat toward the printed circuit board.

BRIEF DESCRIPTION OF THE DRAWINGS

FIG. 4 is a cross-sectional view of a connector in accordance with the present invention; and FIG. 5 is a cross-sectional view of a compressor mat and restrainer member in accordance with a modified embodiment of the invention.

DESCRIPTION OF THE PREFERRED EMBODIMENTS

Figure 1:
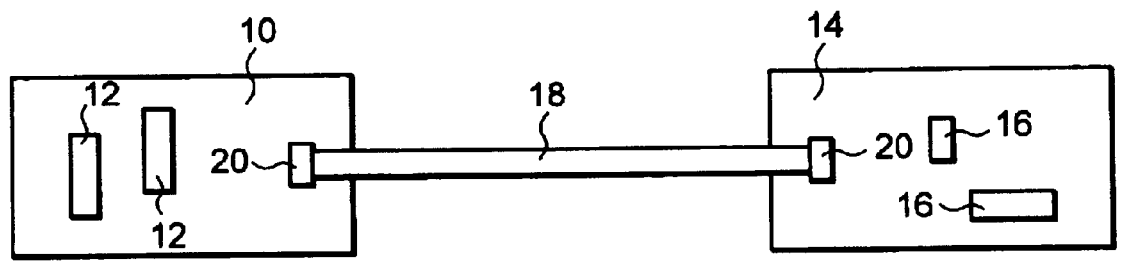
FIG. 1 is a top view schematically illustrating two printed circuit boards and a ribbon cable that connects them by way of two connectors in accordance with the present invention.

The present invention is directed to an improved connector that can be used, for example, to connect a ribbon cable to contact pads on an integrated circuit board. FIG. 1 illustrates a first printed circuit board 10 having circuitry such as integrated circuits 12 and a second printed circuit board 14 having circuitry such as integrated circuits 16. A ribbon cable 18 having a plurality of parallel conductors (not shown in FIG. 1) carries signals between the circuitry of the first and second printed circuit boards 10 and 14. Reference number 20 designates a clamping plate that is part of a connector 22 (see FIG. 4) that connects the left end of cable 18 to the circuitry on printed circuit board 10. Similarly, the right end of cable 18 is connected to the circuitry on printed circuit board 14 by a connector 22 that includes a clamping plate 20.

Figure 2:
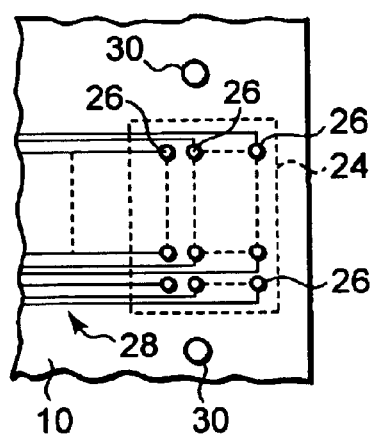
FIG. 2 is a top view of a contact region on a broken-away portion of one of the printed circuit boards shown in FIG. 1.

FIG. 2 illustrates a contact region 24 on the top side of printed circuit board 10. The region 24 contains an array of contact pads 26. Dotted lines that are shown in FIG. 2 between the contact pads 26 are intended to indicate that more contact pads are typically present in the contact region 24 than are shown in FIG. 2. Printed wiring 28 connects the contact pads 26 to the circuitry carried by the printed circuit board 10. The printed circuit board 10 is provided with alignment holes 30 adjacent the ends of the contact region 24.

Figure 3:
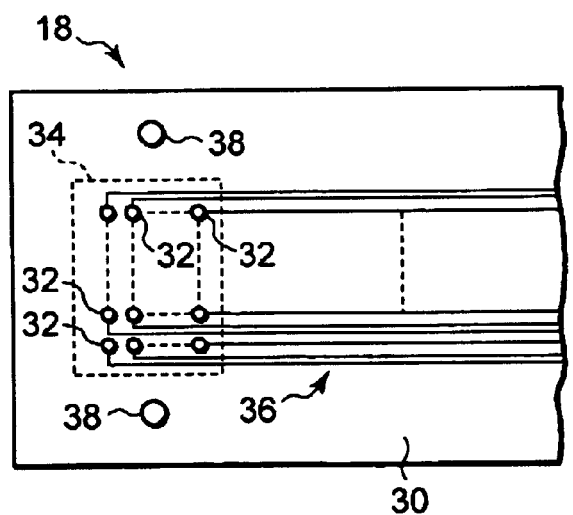
FIG. 3 is a bottom view of a contact region on a broken-away portion of the ribbon cable shown in FIG. 1.

FIG. 3 illustrates the bottom side of the left end of the ribbon cable 18. It includes a flexible plastic strip 30 with an array of contact members 32 that are grouped within a contact region 34. Dotted lines are used between the contact members 32 in FIG. 3 in order to indicate that more contact members are typically present than are actually shown in the drawing. Printed wiring 36 is carried by the strip 30 and connected to the contact members 32. Although the printed wiring 36 in FIG. 3 is located on the same side of strip 30 as the contact members 32, the wiring 36 may be provided on the reverse side of the strip 30 and connected electrically to the contact members 32 by plated through-holes (not shown). The strip 30 is provided with an alignment hole 38 adjacent each end of the contact region 34.

When the ribbon cable 18 is inverted and the holes 38 are aligned with the holes 30 in the printed circuit board 10, the contact region 34 will be aligned with the contact region 24 and the contact members 32 of the ribbon cable 18 will be positioned directly above corresponding contact pads 26 on the printed circuit board 10.

With reference to FIGS. 2–4 together, the connector 22 includes the contact pads 26, the contact members 32, a compression mat 40 having an array of compressor fingers 42 that are located so as to press the contact members 32 against the contact pads 26, and a clamping assembly 44 which presses the compression mat 40 toward the printed circuit board 10. This exerts a compressive force on the compressor fingers 42, which act somewhat as springs. However, the compression mat 40 and its compressor fingers 42 are made of a rubbery, elastomeric material such as thermal silicon rubber. As was discussed in the "Background of the Invention" section of this document, the elastomeric material has a tendency to relax over a period of time after it has been placed in a state of compression. It is believed that this tendency for the elastomeric material to relax is accompanied by a slight increase in the bulge of the compressor fingers 42 or possibly a redistribution of the bulge. At any rate, the result is that the pressure forcing the contact members 32 against the contact pads 26 would ordinarily be reduced after the clamping assembly 44 is originally tightened. In order to reduce the tendency of the elastomeric material to relax, the connector 22 also includes a restrainer member 46. It is made of a pliable material having a stiffness, or durometer measurement, which is smaller than that of the elastomeric material of the compression mat 40.

The purpose of the clamping assembly 44 is to force the compression mat 40 toward the printed circuit board 10. It will be apparent that there are many possible ways to achieve this purpose and that the clamping assembly 44 may take many forms. In the form shown in FIG. 4, the clamping assembly 44 includes a clamp member 48 having two cylindrical alignment arms 50. Threaded metal bolts 52 are embedded in the alignment arms 50 and have outer portions that extend above them. The clamp member 48 may be made by an injection molding process.

The clamping assembly 44 also includes nuts 54 that screw onto the bolts 52 and cap elements 56 beneath the nuts 54. The cap elements 56 have disk-shaped upper surfaces with holes in them for passage of the bolts 52, and cylindrical skirts that extend downward to press against the clamping plate 20, which is also part of the clamping assembly 44. The clamping plate 20 has holes (not numbered) for passage of the alignment arms 50.

During assembly, the alignment arms 50 are threaded through the alignment holes 30 (see FIG. 2) of the printed circuit board 10, the alignment holes 38 (see FIG. 3) of the ribbon cable 18, alignment holes 58 and 60 in the compression mat 40 and the restrainer member 46, respectively, and the holes in the clamping plate 20. The exposed outer portions of the threaded bolts 52 are threaded through the holes in cap elements 56 and nuts 54 are screwed on to the bolts 52. The nuts 54 are then tightened to compress the compression fingers 42 so as to force the contact members 32 tightly against the contact pads 26.

Compression mats with compression fingers are commercially available from InterCon Systems, Inc., of Harrisburg, Pa. as part of their C-BYTE™ connector system. Alternatively, the compression mat 40 can be made by injection molding, from (for example) thermal silicon rubber. Other suitable materials include polyurethane, flexibilized epoxies, and thermoplastic elastomers.

The restrainer member 46 can be made by placing the restrainer member 46 in a tray and then filling the tray to a suitable height with a polyurethane compound that has been heated to (for example) 60° C. The polyurethane is not poured over the compressor fingers 42 themselves, but is, instead, introduced through a nozzle at their base and allowed to rise to a suitable height. A suitable polyurethane compound is commercially available from Chemical Innovations Limited of Preston, England, under their trademark MONOTHANE A30. After it is poured, the polyurethane can be cured by heating it at approximately 150° C. for about 2 hours.

The inventors have confirmed the effectiveness of a restrainer member, made as discussed above, in an experiment. The results of this experiment are shown in the following Table:

TABLE

| Relaxation time (hours) | Normal Force @ 31 mils compression pounds) | | % Load Loss |
| --- | --- | --- | --- |
| | Compression mat w/o restrainer member | Compression mat with restrainer member | |
| 0 | 32.39 | 35.75 | 47.3 |
| 48 | 17.07 | 30.80 | 13.8 |

In this experiment, the force initially required to compress the compressor, fingers by 31 mils was 35.75 pounds when the compressor fingers 42 were fortified by a restrainer member 46, and this fell to 30.80 pounds after a relaxation time of 48 hours. In contrast, for a compressor mat 40 without a restrainer member 46, the force initially required to compress the compressor fingers by 31 mils was 32.39 pounds, and this fell to 17.07 pounds after a relaxation time of 48 hours. In short, the amount of stress relaxation of the compressor fingers 42 with the restrainer member was less than a third of the stress relaxation without the restrainer member 46.

The relaxation-retarding properties of the restrainer member 46 can be varied by varying the Shore hardness of the material from which a restrainer member 46 is made (in this example, MONOTHANE A30 polyurethane) and also by varying the thickness of the material in the interstitial spaces between the compressor fingers 42. Although it has been found that polyurethane with a hardness of Shore A30 and a height (in the interstitial spaces between the compressor fingers 42) of about 50 to 75% of the length of the compressor fingers 42, counteracts the relaxation of the compression mat 40 admirably, it is believed that other hardnesses and heights would also provide satisfactory results.

FIG. 5 illustrates a different technique for making the retainer member 46. First, in this technique, the retainer member 46 is fabricated by injection molding as a separate element having the alignment holes 58 and holes 62 for receiving the compressor fingers 42. This separate element can then be lubricated (for example, by silicone oil) and inserted onto the compressor fingers 42, as indicated schematically by the arrow 66.

In addition to polyurethane, the restrainer member 46 could be made from silicone, flexibilized epoxies, or thermoplastic elastomers. If a thermoplastic elastomer is used, though, it would need to be molded around the compression mat 40 in either a secondary molding operation or a two-shot process (or as a separate, pre-formed element as in FIG. 5). Regardless of the material that is used for the restrainer member 46, it should be softer than the material used for the compression mat 40.

It will be apparent to those ordinarily skilled in the art that the embodiments described above are susceptible to various changes, modifications, and adaptations, and it is intended that such changes, modifications, and adaptations be covered by the appended claims.

What we claim is:

1. A connector for providing electrical connections to wiring on a printed circuit board, comprising:
    connector pads disposed within a contact region on the printed circuit board;
    an insulating substrate having first and second sides;
    contact members disposed within a contact region on the first side of the substrate, the contact region of the substrate being aligned with the contact region of the printed circuit board;
    a compression mat having elongated compressor fingers that contact the second side of the substrate in alignment with the contact regions on the first side, the compressor fingers having a predetermined length and a width that is substantially smaller than the length;
    a clamping arrangement that presses the compression mat toward the printed circuit board; and
    a restrainer member having holes through which the compressor fingers extend.
2. The connector of claim 1, wherein the substrate comprises a flexible plastic strip.
3. The connector of claim 1, wherein the restrainer member comprises an injection-molded element that is subsequently attached to the compression mat.
4. The connector of claim 1, wherein the compression mat is made of a resilient material, and the restrainer member is made of a resilient material that is softer than the resilient material of the compression mat.
5. The connector of claim 1, wherein the restrainer member is made of resilient material.
6. The connector of claim 5, wherein the resilient material comprises polyurethane.
7. The connector of claim 6, wherein the polyurethane has a Shore hardness of about A30.
8. The connector of claim 1, wherein the restrainer member is made by depositing a precursor material in a liquid state on the compression mat and then curing the precursor material.
9. The connector of claim 8, wherein the precursor material comprises polyurethane.
10. A method for electrically connecting connector pads that are disposed within a contact region on a printed circuit board to contact members that are disposed within a contact region on a first side of an insulating substrate, comprising:
    (a) bracing elongated compressor fingers of a compression mat with a restrainer member having holes through which the compressor fingers extend, the compressor fingers having a predetermined length and a width that is substantially smaller than the length;
    (b) placing the contract region of the substrate in face-to-face relationship with the contact region of the printed circuit board;
    (c) positioning the compression mat adjacent a second side of the substrate, with the contact fingers being aligned with the contact members on the first side; and
    (d) pressing the compression mat toward the printed circuit board.
11. The method of claim 10, wherein step (a) is conducted by injection-molding the restrainer member around the compressor fingers of the compression mat.
12. The method of claim 10, wherein step (d) comprises tightening fastening members of a clamping arrangement which secures the substrate and the compression mat to the printed circuit board.
13. The method of claim 10, wherein step (a) comprises depositing a liquid material on the compression mat, and hardening the liquid material to form a resilient body through which the compressor fingers extend.
14. The method of claim 13, wherein the liquid material is a heated polyurethane composition, and the step of hardening the liquid material comprises curing the polyurethane composition at an elevated temperature for a predetermined period of time.
15. The method of claim 13, wherein the liquid material is selected from the group consisting of polyurethane, silicone, and flexibilized epoxies.
16. The method of claim 10, wherein step (a) comprises fabricating the restrainer member from a resilient material, and inserting the restrainer member onto the compression mat.
17. The method of claim 16, wherein the step of fabricating the restrainer member is conducted by injection-molding the restrainer member from a thermoplastic elastomer.
18. The method of claim 10, wherein the compression mat is made of a resilient material, and the restrainer member is made of a resilient material that is softer than the resilient material of the compression mat.
19. The method of claim 18, wherein the resilient material from which the restrainer member is made is selected from the group consisting of polyurethane, silicone, flexibilized epoxies, and thermoplastic elastomers.

* * * * *